United States Patent [19]

Masaki et al.

[11] 3,913,123

[45] Oct. 14, 1975

[54] BIPOLAR TYPE SEMICONDUCTOR INTEGRATED CIRCUIT

[75] Inventors: Akira Masaki, Kodaira; Masaharu Kubo, Hachioji; Tsuneyo Chiba, Kodaira, all of Japan

[73] Assignee: Hitachi, Ltd., Japan

[22] Filed: Mar. 27, 1973

[21] Appl. No.: 345,469

[30] Foreign Application Priority Data

Mar. 27, 1972 Japan ............................... 47-29718

[52] U.S. Cl. ....................... 357/34; 357/20; 357/43; 357/46; 357/36

[51] Int. Cl.[2] .................. H01L 29/72; H01L 29/06; H01L 27/02

[58] Field of Search .......... 317/235; 357/34, 20, 43, 357/46, 36

[56] References Cited

UNITED STATES PATENTS

| | | | |
|---|---|---|---|
| 3,574,008 | 4/1971 | Rice | 148/175 |
| 3,697,827 | 10/1972 | Simon | 317/235 |
| 3,699,406 | 10/1972 | Mapother et al. | 317/DIG. 234 |
| 3,717,507 | 2/1973 | Abe | 148/1.5 |
| 3,717,515 | 2/1973 | Ashar et al. | 148/175 |

*Primary Examiner*—Michael J. Lynch
*Assistant Examiner*—E. Wojciechowicz
*Attorney, Agent, or Firm*—Craig & Antonelli

[57] ABSTRACT

A bipolar type semiconductor integrated circuit has an n-type semiconductor layer formed on a p-type semiconductor substrate, a p-type semiconductor region formed within the n-type semiconductor layer, and an n-type semiconductor region formed within the p-type semiconductor region. A part of the n-type semiconductor layer portion is positioned between the p-type semiconductor substrate and the p-type semiconductor region so as to be narrower than the other part, and the p-type semiconductor substrate is used for the power supply.

9 Claims, 8 Drawing Figures

BIPOLAR TYPE SEMICONDUCTOR INTEGRATED CIRCUIT

BACKGROUND OF THE INVENTION

The present invention relates to a bipolar type semiconductor integrated circuit.

With an integrated circuit employing a bipolar type semiconductor, high speed performance is readily available. On the other hand, an isolation structure for electrically separating individual transistors is required, which has been an obstacle in the case where a high degree of integration is intended.

In order to solve such a problem, heretofore two p-type semiconductor layers have been formed within an n-type semiconductor substrate, with n-type semiconductor layers being formed within one of the p-type semiconductor layers, whereby a negative logic gate consisting of an n-p-n transistor of vertical construction and a p-n-p transistor of horizontal construction is formed.

Where a plurality of logical gates of such structure are to be formed in the same semiconductor substrate, the emitter of each n-p-n transistor and the base of each p-n-p transistor are formed in a common n-type substrate and an isolation structure for the separation between the respectively adjacent logical gates becomes unnecessary.

However, a power source wiring pattern for supplying current to the emitter of each p-n-p transistor is required in every logical gate. The power source wiring pattern occupies a large area on a semiconductor chip, and hinders an optional arrangement of signal wirings. In particular, unless the emitter potentials of the respective p-n-p transistors are made substantially equal, it will be possible for only some of the p-n-p transistors to turn on. It is, necessary, therefore, to make the power source wirings sufficiently low in resistance, so that the area occupied by the power source wiring pattern inevitably becomes large. On the other hand, in random logical circuits, the signal wirings among logical gates are very complicated. It is impractical that the chip surface on which such complicated signal wirings are to be made is occupied by the large power source wiring pattern.

In order to eliminate the aforesaid disadvantages of the prior art a method has been proposed in which the electric wirings are not especially made for the emitter electrodes of the p-n-p transistors, and the chip surface is irradiated by light, to inject carriers from the energy of the light. With this method, however, the conversion efficiency of the energy is inferior. In addition, the quantity of light impinging on the chip surface becomes non-uniform due to the signal wirings. In addition, a special attachment structure for applying the light energy is reguired, and it is poorly compatible with conventional attachment techniques.

SUMMARY OF THE INVENTION

The principal object of the present invention is to provide a bipolar type semiconductor integrated circuit in which the occupying area of a power source wiring pattern is small.

Another object of the present invention is to provide a device which can make power source wirings by a simple construction without using any special energy source other than an electrical energy source.

In order to accomplish such objects, the present invention does not employ a transistor of horizontal construction, and constitutes a semiconductor substrate of two layers having the opposite conductivity types, the lower one of the layers being used as a layer for the power supply.

Figure 1:
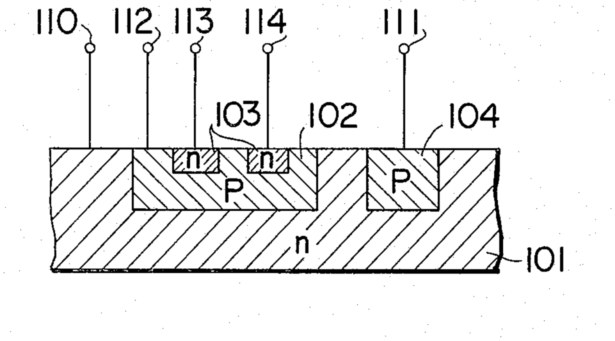
FIG. 1 PRIOR ART
FIG. 1 is a schematic sectional view showing the construction of a part of a prior-art semiconductor integrated circuit.

DETAILED DESCRIPTION OF THE INVENTION:

FIG. 1 shows the construction of a prior-art bipolar type semiconductor integrated circuit. An n-type semiconductor substrate 101 has a p-type semiconductor layer 102 formed therein by, for example, diffusion. Further, a plurality of n-type semiconductor layers 103 are formed in the p-type layer 102. At a position different from that of the p-type semiconductor layer 102, a semiconductor layer 104 of the same p-type is formed.

The respective semiconductor layers and the semiconductor substrate are provided with terminals 110–114.

With such construction, an n-p-n transistor of vertical construction is constituted of the n-type semiconductor substrate 101, the p-type semiconductor layer 102 and the n-type semiconductor layers 103. A p-n-p transistor of horizontal construction is constituted of the p-type semiconductor layer 104, the n-type semiconductor substrate 101 and the p-type semiconductor layer 102.

Figure 2:
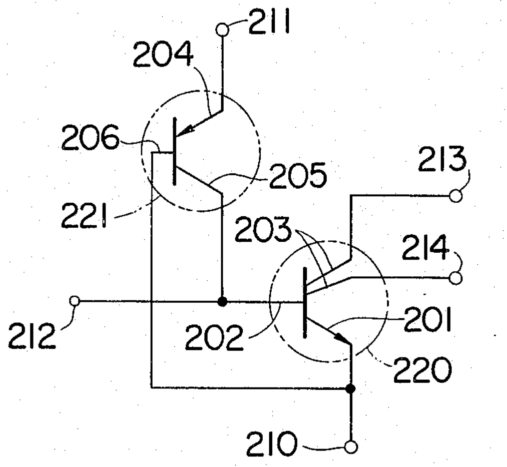
FIG. 2 is a diagram in which the circuit in FIG. 1 is represented by an equivalent circuit.

FIG. 2 represents a schematic circuit representation of the construction of FIG. 1. The n-type semiconductor substrate 101, the p-type semiconductor layer 102 and the n-type semiconductor layers 103 in FIG. 1 correspond to an emitter 201, a base 202 and collectors 203 of a transistor 220 in FIG. 2, respectively. The p-type semiconductor layer 104, the n-type semiconductor substrate 101 and the p-type semiconductor layer 102 in FIG. 1 correspond to an emitter 204, a base 206 and a collector 205 of a transistor 221 in FIG. 2, respectively. Further, the terminals 110, 111, 112, 113 and 114 in FIG. 1 correspond to terminals 210, 211, 212, 213, and 214 in FIG. 2, respectively. Accordingly, if the current amplification factor $\beta$ in the grounded emitter operation of the n-p-n transistor 220 and the current amplification factor $\alpha$ in the grounded base operation of the p-n-p transistor 221 ae selected at suitable values, for example, 9 and 0.6, respectively, and if the terminal 210 is grounded and a current source is connected to the terminal 211, then a negative logic circuit will be provided in which the terminal 212 is an input terminal, the terminals 213 and 214 are output terminals and the transistor 221 is a load for the preceeding stage circuit.

Figure 3:
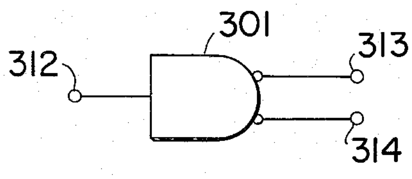
FIG. 3 is a diagram in which the circuit in FIG. 2 is represented by logic symbols.

FIG. 3 represents the circuit of FIG. 2 in the form of a logic symbol. Numeral 301 designates a negative logic gate consisting of the transistors 220 and 221 in FIG. 2. Numerals 312, 313 and 314 indicate terminals respectively corresponding to terminals 212, 213, and 214 in FIG. 2.

Where a plurality of logical gates of the above structure are to be formed in the same semiconductor substrate, they can be formed in the common n-type semiconductor substrate as the emitter 201 of each n-p-n transistor 220 and the base 206 of each p-n-p transistor 221 should be commonly grounded. No particular isolation structure is required between the adjacent logic gates. As illustrated in FIGS. 1 to 3, a plurality of independent outputs can be derived from the same logical gate. If outputs from different logic gates are coupled, an OR function of negative logic will be obtained on the output side. Any desired logic function is, accordingly, obtainable merely by appropriately combining a plurality of fundamental gates described above.

The above method does not need any special structure for the electrical isolation between the unit circuits, and is greatly effective in improving previous techniques of forming bipolar type semiconductor integrated circuits. However, a power source wiring pattern for supplying current to the emitters 204 of the p-n-p transistors 221 still occupies a large area on a semiconductor chip, and obstructs a free arrangement of the signal wiring. Especially, unless the potentials of the emitters 204 of the respective p-n-p transistors 221 become substantially equal, there is the possibility that only some of the p-n-p transistors 221 will be conductive. The power source wirings, therefore, must have a sufficiently low resistance, which unavoidably increases the area occupied by the power source wiring pattern. On the other hand, in random logical circuits the signal wirings among the logical gates are very complicated. It is impractical for the chip surface for such complicated signal wirings to be occupied by a large power source pattern.

Figure 4:
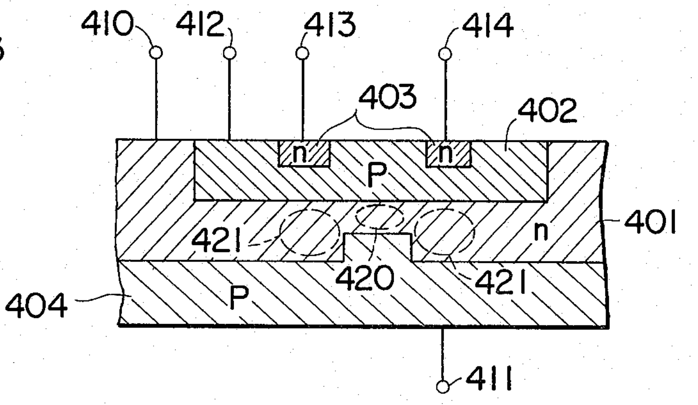
FIG. 4 is a schematic sectional view showing a part of the construction of an embodiment of a semiconductor integrated circuit according to the present invention.

FIG. 4 shows an embodiment of the fundamental structure of a semiconductor integrated circuit according to the present invention.

It is as in the case of FIG. 1, in FIG. 4, n-type semiconductor layers 401 and 403 and a p-type semiconductor layer 402 constitute an n-p-n transistor of vertical construction. A p-n-p transistor is formed, not with a horizontal construction, but with a vertical construction in which a p-type semiconductor layer 404 at the lowermost part of the substrate is an emitter, the n-type semiconductor layer 401 is a base and the p-type semiconductor layer 402 is a collector. A power source connection to the emitter of the p-n-p transistor is effected by a terminal 411 which is connected to the lowest part of the substrate.

Accordingly, the structure in FIG. 4 becomes quite the same as in FIGS. 2 and 3 when illustrated by equivalent circuits. Terminals 410–414 in FIG. 4 correspond to those 210–214 in FIG. 2, respectively. The electrical and logical operations are carried out as in the cases of FIGS. 2 and 3. Also, as in the prior-art case of FIGS. 1 to 3, the electrical isolation between unit circuits is not necessary.

With the structure in FIG. 4, the effective transistor operation of the p-n-p transistor occurs mainly at parts other than regions directly under the collectors of the n-p-n transistor. The above operation is efficiently carried out in such way that a part 420 effectively acting as the base of the p-n-p transistor is made thinner than parts 421 effectively acting as the emitter of the n-p-n transistor. For example, the part 420 may be made one micron thick, and the part 421 3 microns thick.

The manufacture of the integrated circuit thus constructed can be conducted by a combination of a diffusion process, an epitaxial vapor growth process etc. which have hitherto been known per se. Herein, an example of the manufacture will be explained.

On a p-type semiconductor substrate 404 a part of which has a p+ semiconductor layer embedded therein, an n-type semiconductor layer 401 is formed by the epitaxial vapor growth. At the time, the p+ semiconductor layer is diffused into the n-type semiconductor layer 401, so that a narrow portion 420 is formed.

Thereafter, a p-type semiconductor layer 402 is formed in the n-type semiconductor layer 401 by diffusion. Further, n-type semiconductor layers 403 are formed in the p-type semiconductor layer 402 by the diffusion. Finally, connections to terminals 410–414 are provided.

As is apparent from the structure shown in FIG. 4, in accordance with the present invention, no conductor pattern for supplying current to the emitter of the p-n-p transistor is present on the chip surface which is to be occupied by the signal wiring. It is only necessary to arrange on the chip surface a fractional power source pattern for grounding then-type semiconductor layer 401. Therefore, the degree of freedom of the signal wiring is remarkably enhanced. Furthermore, according to the present invention, there is attained the great advantage that the area which the emitter of the p-n-p transistor occupies in the chip surface is extremely small, allowing the chip area to be used more efficiently. Furthermore, the power source wirings for the lowest layer of the substrate can be made on one surface, and the lowest layer portion can be made as thick as permitted by the manufacturing technique, so that the emitters of the p-n-p transistors can be readily held at substantially perfectly equal potentials. This leads to the great merit of the present invention that, where a large-scale integrated circuit is constructed, a stable operation is easily attained.

Since a source of special energy such as light need not be used, a semiconductor device of high efficiency and simple structure can be provided.

Figure 5:
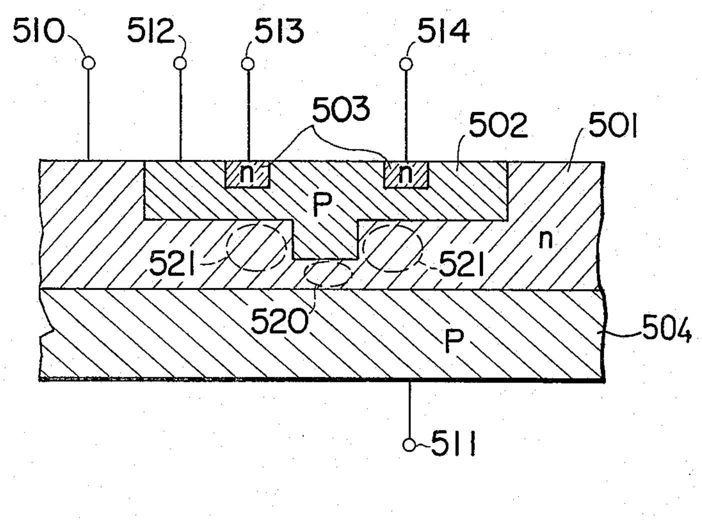
FIG. 5 is a schematic sectional view showing a part of the construction of another embodiment of the semiconductor integrated circuit according to the present invention.

FIG. 5 shows the construction of another embodiment of the semiconductor integrated circuit according to the present invention. It illustrates another example of the formation of the thin part (520 in the figure) serving as the base of the p-n-p transistor.

In FIG. 5, semiconductor layers 501–504 correspond to those 401–404 in FIG. 4, respectively. Terminals 510–514 correspond to those 410–414 in FIG. 4, respectively. Further, parts 520 and 521 correspond to those 420 and 421 in FIG. 4, respectively.

In the example, the narrow base portion 520 is formed by providing a projecting part in the p-type semiconductor layer 502.

In order to produce the device of such construction, instead of embedding a p+ layer in the p-type semiconductor substrate 504 and then conducting the diffusion, the diffusion for the p-type semiconductor layer 502 is carried out and the diffusion for the narrow region corresponding to the protruding part is carried out. The other steps of production are similar to the case of FIG. 4.

It is needless to say that the combination of both the constructions in FIGS. 4 and 5 can also be employed.

Figure 6:
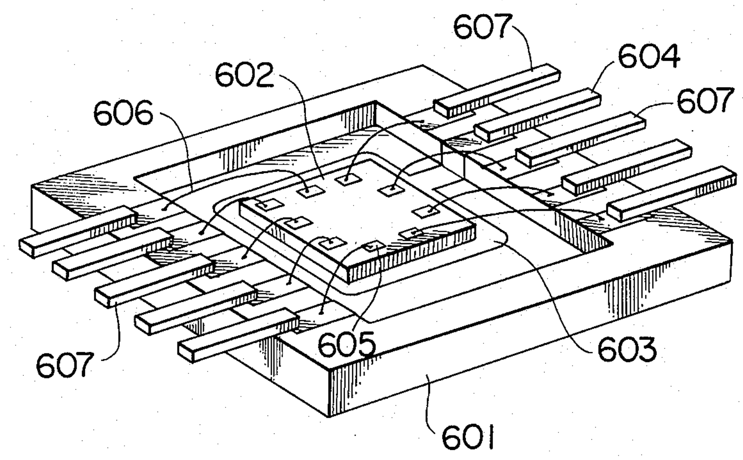
FIG. 6 is a perspective view showing the structure of a package in which the semiconductor integrated circuit according to the present invention is attached.

FIG. 6 shows an example of the structure of a package in which the semiconductor integrated circuit chip according to the present invention is equipped.

In FIG. 6, numeral 601 indicates a package body, while numeral 602 designates an integrated circuit chip according to the present invention. Shown at 603 is a conductor pattern for supplying power to the lowermost layer of the substrate of the chip. The conductor pattern is joined with the chip by a conductive material, while it is connected to a terminal 604 of the package. Terminals 605 on the chip for grounding the chip and for transferring signals are connected to terminals 607 of the package by means of conductor wires 606 by a known wire bonding technique.

When it is necessary to insert resistances in series with the emitters of the p-n-p transistors and outside the chip, the resistances can be formed as a part of the pattern 603 inside the package by, for example, the known thick-film technique.

Figure 7:
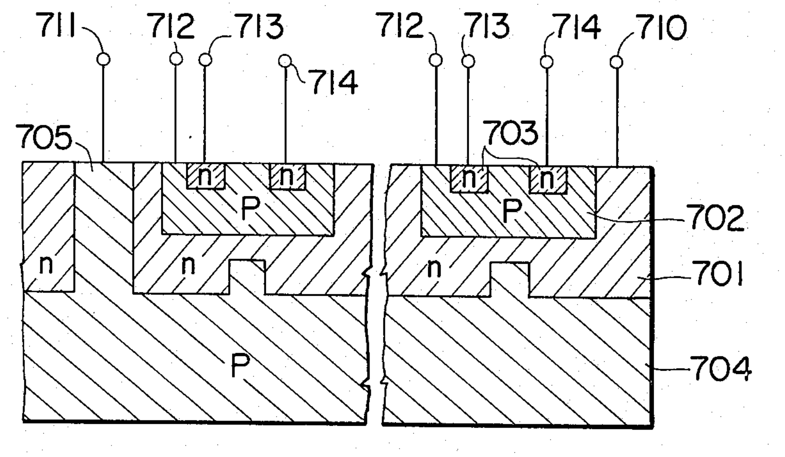
FIG. 7 is a schematic sectional view showing still another embodiment of the semiconductor integrated circuit according to the present invention.

FIG. 7 shows still another embodiment of the semiconductor integrated circuit according to the present invention, the embodiment being so constructed that all the terminals are led out from only one surface of the chip. As is apparent from the figure, according to the embodiment, a terminal for supplying power to the lowest layer is connected from the chip surface through a post-shaped p-type semiconductor layer 705 to the lowermost layer, so that so-called face-down bonding can also be carried out. The thickness of layer 701 between post-shaped p-type semiconductor layer 705 and layer 702 is larger than the distance between the layers 702 and 704. For example, the distance between the protruding portion of layer 704 toward layer 702 into layer 701 and the bottom of layer 702 is about 1 micron, while the separation of layer 705 and layer 702 through layer 701 is about 10 microns thick, so as to avoid horizontal transistor operation. With this embodiment, a diffusion step is added due to the formation of the pillar-like semiconductor layer 705. Since, however, this part is only a fraction of the whole chip, the feature of the present invention which enables a high-density installation hardly suffers. Although the diffusion step is added due to the formation of the post-like part, any difficulty in operations such as mask registration of the post-shaped part does not present a serious problem since the post is local.

Semiconductor layers 701–704 correspond to those 401–404 in FIG. 4, respectively. Terminals 710–714 correspond to those 410–414, in FIG. 4, respectively.

Figure 8:
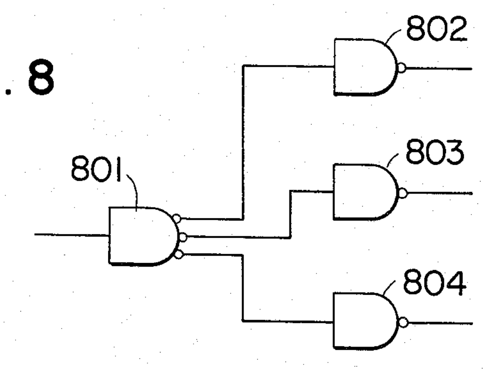
FIG. 8 is a diagram showing an example of the connection state of the semiconductor integrated circuit according to the present invention.

FIG. 8 illustrates an example of the method of connecting signal wirings within the semiconductor integrated circuit according to the present invention. Shown in the figure is a case where the output of a specific negative logic gate 801 is used to drive a plurality of other negation logic gates 802, 803 and 804.

In the example, the device is so constructed as to drive only one load gate by one gate output. Therefore, the phenomenon of current over drive does not occur.

Although, in the above description, p-type and n-type etc. have been specified as examples, the present invention is of course applicable to all cases where the specified conductivity types are opposite to each other.

Although the power supply to the various terminals has been explained using the expressions of grounding etc. for the sake of convenience, it is also covered within the scope of performance of the present invention to appropriately change the potential levels of the various portions to other values.

Further, although the case where a plurality of outputs are provided, namely, where the n-p-n transistor has a plurality of collectors has been referred to in any of the foregoing embodiments, it is needless to say that the present invention is similarly applicable to a case where the n-p-n transistor has a single collector.

We claim:

1. A bipolar type semiconductor integrated circuit for a negative logic circuit comprising:

a first semiconductor layer having a first conductivity type, having first and second principal surfaces, and constituting the base of a first transistor and the emitter of a second transistor;

a second semiconductor layer of a second conductivity type, opposite said first conductivity type, having first and second principal surfaces, said first principal surface of said second semiconductor layer being disposed upon the second principal surface of said first semiconductor layer, said second semiconductor layer constituting the emitter of said first transistor;

a first semiconductor region of said second conductivity type disposed in the first principal surface of said first semiconductor layer, and constituting the collector of said first transistor and the base of said second transistor;

at least two second semiconductor regions of said first conductivity type disposed in said first semiconductor region, which are separated from each other and constitute at least two collectors of said second transistor;

first and second terminals for supplying power, connected to said first semiconductor layer and to said second semiconductor layer, respectively; and an input terminal and at least two output terminals connected to said first semiconductor region and to said at least two second semiconductor regions, respectively; and wherein a first selected portion of the interface between said first semiconductor layer and said first semiconductor region is spaced from the interface between said first and second semiconductor layers opposite said first selected portion by a first prescribed portion of said first semiconductor layer which is less than the separation between said interfaces at the remaining portions thereof.

2. The bipolar type semiconductor integrated circuit for a negative logic circuit according to claim 1, wherein the depth of said first semiconductor region from said first principal surface of said first semiconductor layer into said first semiconductor layer is greater at said first selected portion than over the remainder of said first semiconductor region.

3. The bipolar type semiconductor integrated circuit for a negative logic circuit according to claim 1, wherein the distance between the first and second principal surfaces of said first semiconductor layer is smaller at the portion of the interface between said first and second semiconductor layers opposite said first selected portion than over the remainder of said first semiconductor layer.

4. The bipolar type semiconductor integrated circuit for a negative logic circuit according to claim 1, further including a third region of said second conductivity type extending from the first principal surface of said first semiconductor layer through said first semiconductor layer and being contiguous to said second semiconductor layer.

5. The bipolar type semiconductor integrated circuit for a negative logic circuit according to claim 1, further including a third region of said second conductivity type extending from the first principal surface of said first semiconductor layer through said first semiconductor layer and being contiguous to said second semiconductor layer, with said first power supplying terminal being connected to said first semiconductor layer through said third semiconductor region.

6. A bipolar type semiconductor integrated circuit for a negative logic circuit comprising:

a first semiconductor layer having a first conductivity type, having first and second principal surfaces, and constituting the base of a first transistor and the emitter of a second transistor;

a second semiconductor layer of a second conductivity type, opposite said first conductivity type, having first and second principal surfaces, said first principal surface of said second semiconductor layer being disposed upon the second principal surface of said first semiconductor layer, said second semiconductor layer constituting the emitter of said first transistor;

a first semiconductor region of said second conductivity type disposed in the first principal surface of said first semiconductor layer, and constituting the collector of said first transistor and the base of said second transistor;

a second semiconductor region of said first conductivity type disposed in said first semiconductor region, constituting a first collector of said second transistor;

a third semiconductor region of said first conductivity type disposed in said first semiconductor region at a different portion where said second semiconductor region is disposed, constituting a second collector of said second transistor;

first and second terminals for supplying power, connected to said first semiconductor layer and said second semiconductor layer, respectively;

an input terminal connected to said first semiconductor region; and first and second output terminals connected to said second and fourth semiconductor regions, respectively; and wherein a first selected portion of the interface between said first semiconductor layer and said first semiconductor region is spaced from the interface between said first and second semiconductor layers opposite said first selected portion by a first prescribed portion of said first semiconductor layer which is less than the separation between said interfaces at the remaining portions thereof and which is an intermediate portion between portions of said first semiconductor layer corresponding to the second and third semiconductor regions.

7. The bipolar type semiconductor integrated circuit for a negative logic circuit according to claim 6, wherein the depth of said first semiconductor region from said first principal surface of said first semiconductor layer into said first semiconductor layer is greater at said first selected portion than over the remainder of said first semiconductor region.

8. The bipolar type semiconductor integrated circuit for a negative logic circuit according to claim 6, wherein the distance between the first and second principal surfaces of said first semiconductor layer is smaller at the portion of the interface between said first and second semiconductor layers opposite said first selected portion than over the remainder of said first semiconductor layer.

9. A bipolar type semiconductor integrated circuit for a negative logic circuit according to claim 6, which further includes a fourth semiconductor region of said second conductivity type extending from the first principal surface of said first semiconductor layer through said first semiconductor layer and being contiguous to said second semiconductor layer, with said first power supplying terminal being connected to said first semiconductor layer through said fourth semiconductor region, and wherein the width between a first interface between said first semiconductor region and said second semiconductor layer, opposing said fourth semiconductor region and a second interface between said second semiconductor layer and said fourth semiconductor region, opposing said first interface is wider than that of said second semiconductor layer at said first prescribed portion.

* * * * *